United States Patent
Janssen et al.

(10) Patent No.: US 7,218,263 B2
(45) Date of Patent: May 15, 2007

(54) GENERATING BIT-STREAMS WITH HIGHER COMPRESSION GAINS

(75) Inventors: Erwin Janssen, Eindhoven (NL); Derk Reefman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/574,442

(22) PCT Filed: Oct. 8, 2004

(86) PCT No.: PCT/IB2004/052031

§ 371 (c)(1),
(2), (4) Date: Apr. 4, 2006

(87) PCT Pub. No.: WO2005/036756

PCT Pub. Date: Apr. 21, 2005

(65) Prior Publication Data

US 2007/0018857 A1  Jan. 25, 2007

(30) Foreign Application Priority Data

Oct. 9, 2003  (EP) ................... 03103746

(51) Int. Cl.
*H03M 1/12* (2006.01)

(52) U.S. Cl. .................... 341/155; 341/156
(58) Field of Classification Search .......... 341/155, 341/156

See application file for complete search history.

(56) References Cited

OTHER PUBLICATIONS

Generalized Predictive Trellis Coded Quantization of Speech by Michael W. Marcellin of the Deparment of Electrical & Computer Engineering, The University of Arizona Tucson, AZ; & Thomas R. Fischer of the Department of Electrical and Computer Engineering, Washington State University Pullman, WA. (date unknown).*

* cited by examiner

*Primary Examiner*—Rexford Barnie
*Assistant Examiner*—Joseph Lauture

(57) ABSTRACT

A system (10) and method that generate bit-streams that result in higher compression gains. The system is akin to a normal 1-bit SDM. Internally, the system (10) tries to find the best possible bit sequence by tracing N possible solutions at every time instant. In an implementation, the system has N>I trellis path structures (20). Every path is used to track a possible output bitstream. The quality of a bitstream is determined by measuring the (frequency weighted) difference between input and output; it is this measure that is reduced or minimized.

10 Claims, 9 Drawing Sheets

GENERATING BIT-STREAMS WITH HIGHER COMPRESSION GAINS

This application is a national stage entry of PCT/IB04/52031 filed 10/08/2004.

The present invention relates generally to a system and method for generating bit-streams and more specifically, to a system and method for generating bit-streams with higher compression gains.

Super-Audio Compact Discs (SACDs) use the Direct Stream Digital (DSD) format to store music. This 1-bit data format can be losslessly compressed in order to increase playback time. Since the compression is lossless, the compression gain is signal dependent. Different Sigma Delta Modulator (SDM) designs generate different bit-streams, while having the same or comparable signal and noise transfer function (equal SNR, distortion, etc.). However, some SDM designs generate bit-streams that result in better compression, while other designs result in less compression. Current SDM designs cannot be tuned to deliver more compression gain without signal degradation.

In order to fit 74 minutes of both stereo and multi-channel content on a disc, an average compression gain of 2.7 is required. Because of the signal dependent coding gain, this compression gain is not achievable for all material, not even with the best SDM designs. Pop-music, on which a lot of processing is performed, is problematic and in general, results in a low average compression gain. However, pop-music releases are especially important for the SACD format to become a commercial success.

Recently, several alternatives to the standard 1-bit Sigma Delta Modulator (SDM) have been proposed. These include tree-based, look-ahead sigma delta modulation, time-quantized frequency modulation, and trellis noise-shaping conversion.

FIG. 1 shows the structure of a conventional SDM. In FIG. 1, x(t) represents the input signal, d(t) the error signal, c(t) the frequency weighted error signal, and y(t) the output signal. The filter H(z) represents the frequency weighting (i.e., noise-shaping) function, which is typically a low-pass function for an audio converter. Explicitly shown in FIG. 1 is the delay $z^{-1}$ between the output y(t) and a feedback signal. As a result of this delay $z^{-1}$, the output at $t=t_O$ is determined by the input signal x(t) up to $t=t_O$, but also by the feedback signal up to $t=t_O-1$. The feedback signal is thus in effect a prediction of the future. A correct prediction will generate a feedback signal that results in a small (instantaneous) frequency weighted error signal c(t). A bad prediction will increase the frequency weighted error signal c(t). Since the input signal x(t) is changing relatively slowly compared to the sample rate, most predictions are correct and the conventional SDM is in stable operation. However, since the input x(t) is not known a-priori, the generated output (the feedback signal) will not always be the 'best possible' output. An extreme example of the effect of making incorrect predictions is when an SDM runs unstable and starts to oscillate. The SDM will still try to minimize the instantaneous error, but the total frequency weighted error signal c(t) will be large.

If the complete input sequence to the SDM x(t=0) . . . x(t=N) was known, one could, in theory, construct an output sequence y(t=0) . . . y(t=N) that would minimize the global frequency weighted error $$C = \sum_{t=0}^{t=N} [c(t)]^2 \quad (1)$$

However, for an input sequence with length N, the number of possibilities for the output sequence would be $2^N$, which can in general be approximated by infinity. Therefore, searching for an approximation of this optimal solution is necessary. This is the function of 'full trellis' noise-shaping algorithms.

For full trellis noise-shaping, it is assumed that up to $t=t_O$, the optimal output sequence is known. The output $y(t=t_O+1)$ can be either $-1$ or $+1$, which will result in the instantaneous frequency weighted error $c_0(t=t_O+1)$ and $c_1(t=t_O+1)$, respectively. One time instant later, again an output of either $-1$ or $+1$ is possible, resulting in four different possibilities (paths) for the two output bits. Every path has its own associated cost (called a pathmetric), defined as the sum of the squared frequency weighted error values:

$$C_{W_N}(t) = \sum_{t=0}^{t} [c(\tau)]^2 \quad (2)$$

where $w_N$ is a sequence of N output bits.

Advancing time once more, the number of possibilities doubles again and becomes eight, and so on. The full trellis algorithm limits the number of paths by selecting, and continuing with, only half of the newly generated paths. In a full trellis system of order N, $2^N$ possible solutions are investigated at every moment in time. Advancing time by 1 results in $2^{(N+1)}$ candidates, of which $2^N$ are selected. The $2^N$ solutions under investigation are forced to be all different in the newest N bits, in order to maintain the trellis structure.

FIG. 2 illustrates a conventional trellis with order N=2. FIG. 2 illustrates the four combinations of two bits that are possible for time t-1. FIG. 2 illustrates the origination of new candidates (time t) from old candidates (time t-1). A complete state diagram for $2^N=4$ candidates is shown on the left and the general case is shown on the right. For clarity, the signal level $-1$ is represented by the symbol "0" in FIG. 2.

If to the sequence '00' a '0' is concatenated, '000' is obtained. Adding a '1' results in '001'. Reducing the length of the two possible sequences to two again, results in '00' and '01', respectively. It is clear that starting with '10' would also result in '00' and '01', therefore a choice has to be made and one path has to be selected. The selection criteria may be the total cost of the path; it is assumed that the path with the lower cost will turn out to be the best solution of the two. If $\sigma \in \{-1, 1\}$, single output bit $C_{w_N\sigma}(t)$ is the filter output after processing of $\sigma$ when candidate $W_N$ at t-1 is used.

the cost for the two candidates can be written as $$c_{path\ 1} = C_{0W_{N-1}}(t-1) + [C_{0W_{N-1}\sigma}(t)]^2$$

$$c_{path\ 2} = C_{1W_{N-1}}(t-1) + [C_{1W_{N-1}\sigma}(t)]^2 \quad (3)$$

and the new cost for the path is given by:

$$C_{W_{N-1}\sigma}(t) = \begin{cases} C_{path1} & \text{if } C_{path1} \leq C_{path2} \\ C_{path2} & \text{if } C_{path1} > C_{path2} \end{cases} \quad (4)$$

The output of a system of order N, includes $2^N$ parallel bits. These output bits will in general not be the same, although the trellis algorithm may presume them to be equal. If the system runs long enough, paths converge. This means, that independently of which path is examined, they indicate the same output bit for $t \rightarrow -\infty$. FIG. 3 illustrates the convergence. FIG. 3 illustrates the origination of the four candidates. The different candidates terminate with different output symbols, but in history ($t \rightarrow -\infty$) the output sequences converge to a single solution.

In practice, it is not necessary to trace back to $t \rightarrow -\infty$ in order to unambiguously determine the output of the system. An output latency up to several thousand bits, depending on the trellis order, is usually enough. Every path of the trellis converter has its own output history, all with equal length. One can view the history buffer as a shift register; the newly determined output bit is shifted in, and the latency or history length time steps ago determined output shifts out. In normal situations, all $2_N$ output bits will be equal, and the output is uniquely determined. However, when the history length is not long enough, the different paths might produce different output bits and the output cannot be determined unambiguously. This will result in so-called truncation noise.

Application of a trellis converter increases stability and improves SNR. Simulations have shown, that in order to significantly gain performance, the trellis order needs to be large. Since the workload doubles for every increment of the trellis order, orders higher than 5 or 6 can hardly be used (a 6th order system contains $2^6=64$ SDMs, together with book-keeping overhead, results in an about 100 times more expensive system than a normal SDM). Efficient trellis SDMs are known, which make it possible to reach the performance of a 10th order full trellis converter at the cost of only a 5th order system.

For efficient trellis noise-shaping, it is possible to increase the computational efficiency of the trellis converter by calculating a fraction of the $2^N$ paths, denoted by M. These M paths are processed as if they are part of a normal trellis of order N.

However, there are still performance gains, for example, in terms of required CPU power, stability and linearity compared to a conventional trellis SDMs.

An object of the invention is to refine the concept of efficient trellis noise-shaping and/or introduces a system and method (which may be implemented as an algorithm) that offers much better performance in terms of required CPU power, stability, and/or linearity compared to conventional trellis SDMs.

To this end, a new SDM type is presented that generates bit-streams which result in higher compression gains. A trade-off between required CPU time and resulting compression gain can be made.

In one or more exemplary embodiments, the system includes N weighting-filter devices (where $N \geq 2$), each receiving an input signal and a M-value feedback signal (where $M \geq 2$) and each generating M filtered output signals, a path sorter for applying at least one cost function to the N*M filtered output signals to produce the N cheapest paths, a normalizer for normalizing the N cheapest paths, and an output device for selecting an output signal and for supplying the N M-value feedback signals to the N weighting-filters.

In one or more exemplary embodiments, the at least one cost function is a function of at least one output signal characteristic.

In one or more exemplary embodiments, each of the N weighting-filter devices includes a M-value generator and a filter.

In one or more exemplary embodiments, each weighting-filter device includes a subtractor for subtracting the input signal and the M-value feedback signal and filtering the M output signals.

In one or more exemplary embodiments, the M-value feedback signal includes two values, −1 and 1.

In one or more exemplary embodiments, N is fixed or adaptive. In one or more exemplary embodiments, each of the weighting-filter devices includes a fixed order, fixed frequency response filter; a fixed order, variable frequency response filter; a variable order, fixed frequency response filter; a variable order, variable frequency response filter; or a noise-shaping filter adjustable for Direct Stream Transfer (DST) performance.

In one or more exemplary embodiments, the system is implemented in software and/or hardware.

In one or more exemplary embodiments, the system is used for analog-digital, digital-analog, and/or digital-digital (AD/DA/DD) conversion and/or pulse width modulation (PWM).

In one or more exemplary embodiments, the method includes receiving an input signal and at least two M-value feedback signals (where $M \geq 2$) and generating M*N filtered output signals, applying at least one cost function to the M*N filtered output signals to produce the N cheapest paths, normalizing the N cheapest paths, and selecting an output signal from the N cheapest paths and for generating the at least two M-value feedback signals.

In contrast to the original efficient trellis algorithm, the concept of trellis order is not used. Complexity is determined by the number of paths to process, called trellis depth N. A trellis path structure may include a history buffer with fixed length, path-cost variable, and a trellis SDM integrator state memory.

To this end, a new method (for M=2) is presented, where:
1. For all N paths, the total path cost for the two output bits is determined.
2. The 2N solutions are sorted on total path cost.
3. The N cheapest paths are selected and processing continues.
4. The path costs are normalized.
5. The output bit corresponding to history-length inputs ago is determined.
6. Paths that do not converge are invalidated.

Step 1 may use any cost function or functions. In step 2 in combination with step 3, the number of solutions is halved, in order to keep N paths instead of doubling the number of solutions every time instant. The assumption made is that the cheaper the path, the larger the probability of it being the optimal path. In order to overcome the problem of constantly increasing path cost values, in step 4 the path costs may be normalized, with the cheapest path getting a score of 0, for example. In step 5, the output is determined. This output bit corresponds to the input sample history-length inputs ago. This input-output delay keeps the system causal. Ideally all N paths dictate the same output bit. However, if the history length is not long enough, convergence on the solution has possibly not been reached yet within history-length time steps. If this happens, solutions that are not in agreement with the output (which is based on the best (cheapest) path) can be rejected.

Correct initialization is useful, since N parallel identical SDMs will generate the same output if initialized identical. An exemplary solution is to initialize one path structure to 0 cost, and all the others to a large cost. The expensive paths will die out in $\log_2(N)$ clock cycles and the system will be fully functional, tracing N different paths. As set forth above, in other exemplary embodiments, M may be any value $\geq 2$.

The present invention will become more fully understood from the detailed description given below and the accompanying drawings, which are given for purposes of illustration only, and thus do not limit the invention.

Figure 1:
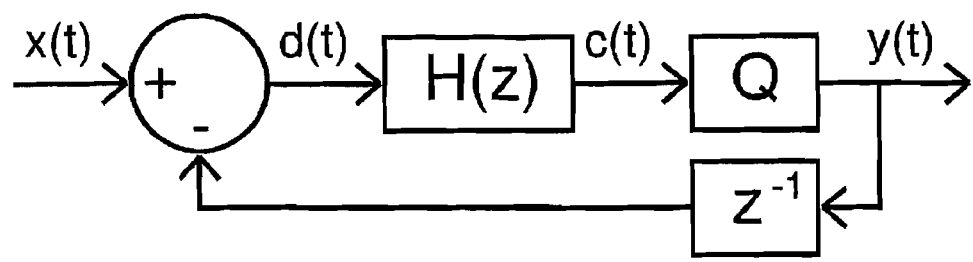
FIG. 1 shows the structure of a conventional SDM.
Figure 2:
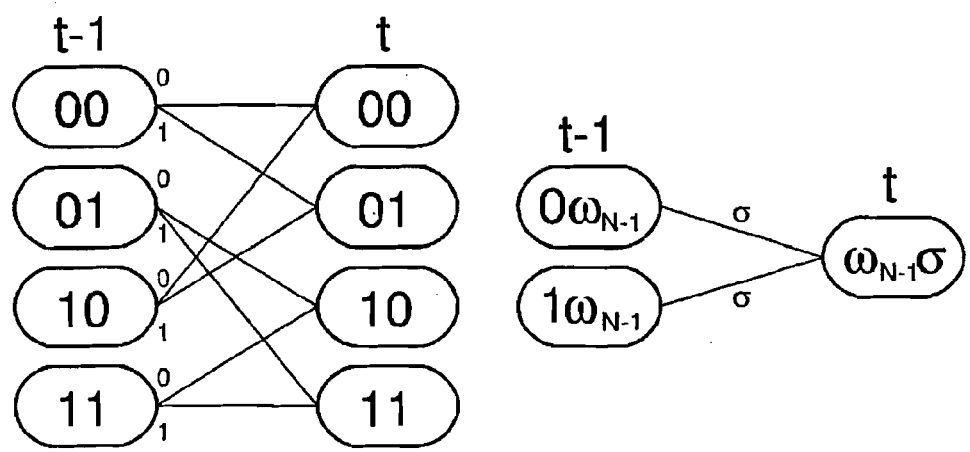
FIG. 2 illustrates a conventional trellis with order N=2.
Figure 3:
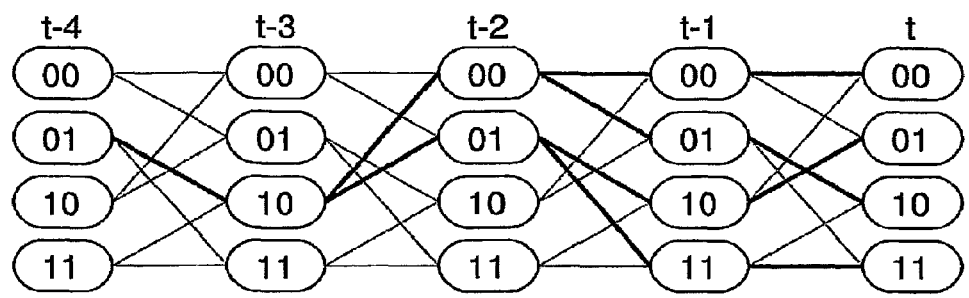
FIG. 3 illustrates the origination of the four candidates and path convergence.
Figure 4:
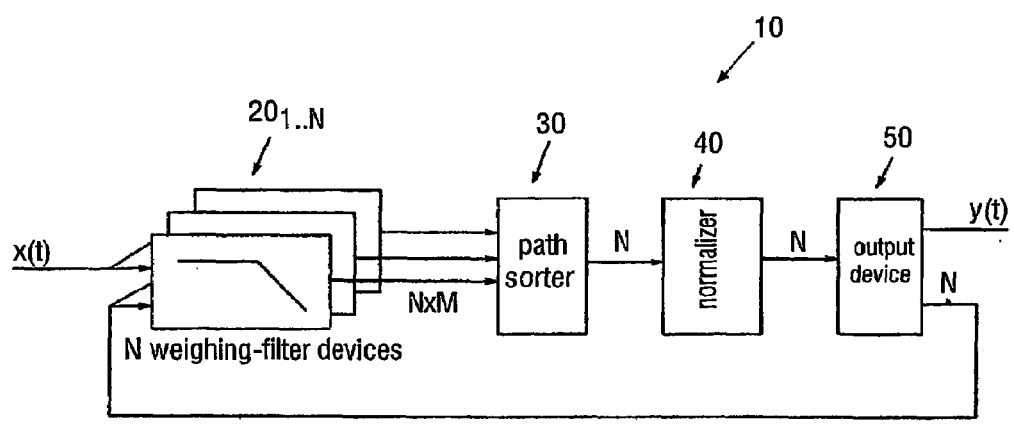
FIG. 4 illustrates a system in accordance with an exemplary embodiment of the present invention.

FIG. 4 illustrates a system 10 in accordance with an exemplary embodiment of the present invention. The system 10 includes N weighting-filter devices (N≧2)$20_{t\ldots N}$ which receive an input signal x(t) and output N×M paths, a path sorter 30 which sorts the N×M paths into the N cheapest paths, a normalizer 40, which normalizes the N cheapest paths to the cheapest path, and an output device 50 which outputs the output y(t) and N feedback signals to the N weighting-filter devices (N≧2)$20_{t\ldots N}$.

FIG. 4 illustrates three weighting-filter devices 20 (although this number could vary). Each weighting-filter device 20 outputs $C_{+1}(t)$ and $C_{-1}(t)$ and the path sorter 30 receives six values C(t) with corresponding integrator states. The values C(t) are sorted in order to find the three paths that have the lowest accumulated cost. The three cheapest paths are then passed to the normalizer 30, where the cost value of the cheapest path is subtracted from all cost values. The normalizer 30 solves the problem of ever increasing values. In strict sense, there is no normalization performed, but only a new reference level set. The normalizer 30 could be implemented as one or more subtractors.

In the output device 50, all output paths that are generated can be different. however, going back in the past, the paths will most likely be equal. The last bit in the history buffer of the cheapest path determines the output. If the paths converge, all paths will have this last bit equal. If the last bit of a path is different from the output, this path can be invalidated. A practical way of doing this is increase the cost of this path by a large amount; the basic operation is thus performing N−1 comparisons and possibly performing N−1 additions.

A generalized algorithm (for M=2, although as set forth above, M may be any value ≧2) representing exemplary embodiments of the present invention may be represented in pseudo-code by:
1. For all N paths determine the total path cost for the two output bits.
2. Sort the 2N solutions on total path cost.
3. Select and continue with the N cheapest paths.
4. Normalize path cost.
5. Determine the output bit corresponding to history-length inputs ago.
6. Invalidate paths that do not converge.

Figure 5:
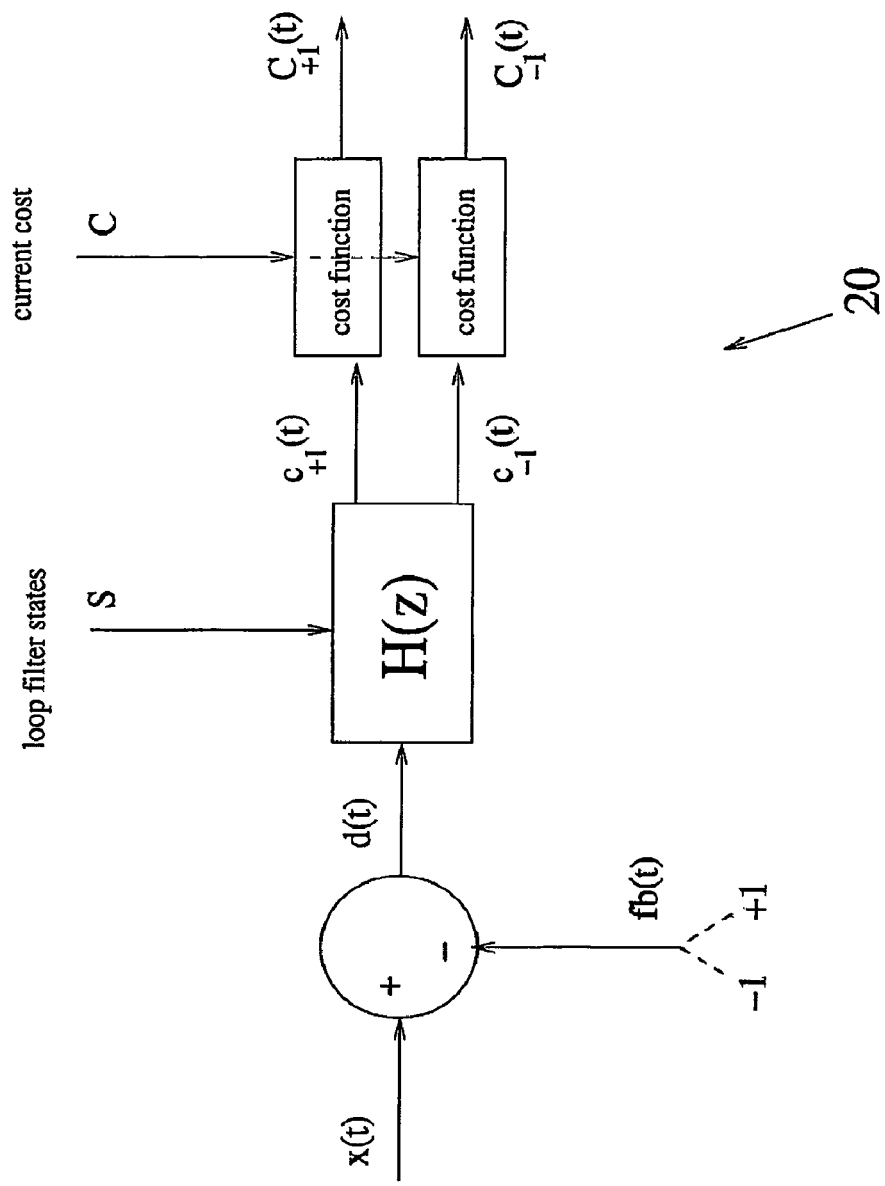
FIG. 5 illustrates a weighting-filter device 20 of FIG. 4, in accordance with an exemplary embodiment of the present invention.

For every path, a weighting-filter device 20 is used. An exemplary weighting-filter device 20 is shown in more detail in FIG. 5. The weighting-filter device 20 receives the input signal x(t), loop filter states S, and current cost C for each path. As shown in FIG. 5, there is no delay between the input x(t) and the output. The signal fb(t) is used as a 'feedback' signal, and need not be generated by means of a quantizer but e.g. by a M-value generator. The value +1 and −1 are applied as signal fb(t). Two outputs are generated and passed on to the path sorter 30.

To determine the output, one or more history buffers may be used. A history buffer is a memory, that remembers the past outputs generated by a weighting-filter device 20. The history buffer(s) can unambiguously determine the output of the system 10; if going back far enough in time, the N paths are all equal. An integrator state memory may also be used for setting and restoring the filter H(z). Applying an input to the filter H(z) changes the integrator states. Since both +1 and −1 can be applied, in between the original integrator states need to be restored. Every path that is traced, has it's own integrator states; the paths are different and thus also the integrator states.

Output include the new path cost, updated history buffer, and updated state variables for both the −1 path and the +1 path. The total path cost for the 0 (−1) branch and 1 (+1) branch, respectively, is given by:

$$c_0(t) = C_W(t-1) + [C_{W0}(t)]^2$$

$$c_1(t) = C_W(t-1) + [C_{W1}(t)]^2 \quad (5)$$

The path cost thus reflects the frequency weighted error of the complete path starting at t=0. In order to overcome the problem of constantly growing path cost values, the path cost can normalized after every time step, with the cheapest path having a cost of 0.

Figure 6:
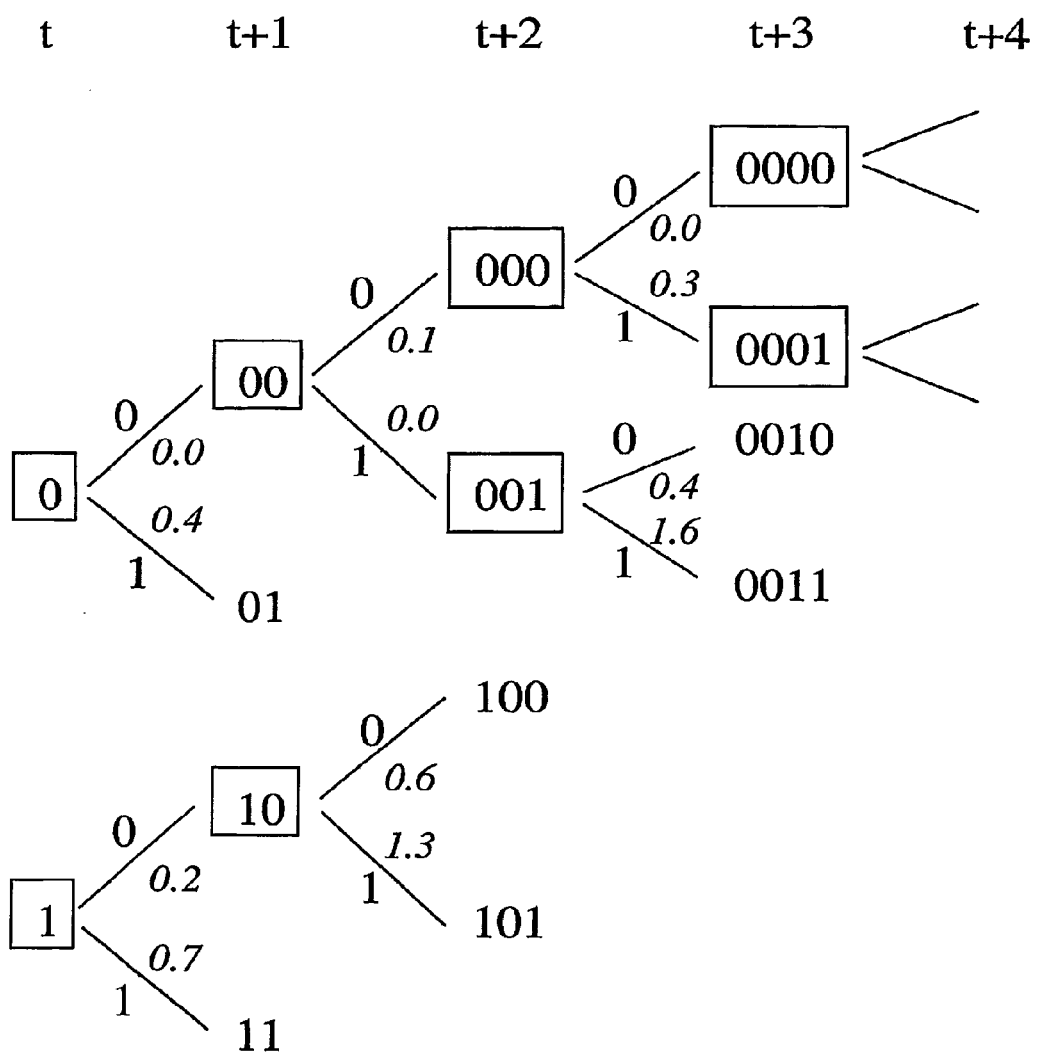
FIG. 6 illustrates the operations of the system of FIG. 4, in accordance with an exemplary embodiment of the present invention.

FIG. 6 schematically shows a system 10 with N=2 calculating its output over four time steps. The resulting bit-streams are shown. The two bit-streams that are kept at each time step have a box drawn around them. The bit-streams without a box will not continue to the next time step. The italic numbers next to the branch lines indicate the normalized path cost for the branch.

At time t, there is a bit-stream '0' and '1'. Concatenating a '0' and '1' to both bit-streams will give the four possible solutions for time t+1. For both paths, the '0' branch results in the cheapest path, resulting in bit-streams '00' and '10' for time t+1. Concatenation of '0' and '1' results in the four new candidate solutions for time t+2. The total path cost for both paths originating from '00' is lower than the cost for the paths originating from '10', which is not continued. The path '00' is duplicated and extended to '000' and '001'. Note that the path that is cheapest at time t+2 will not continue to time t+3; a local minimum will not necessarily result in a global minimum.

It is assumed all N weighting-filter device 20 are initialized the same (e.g. path cost =0, integrator states all 0, and path history buffer filled with digital silence). At startup, all N weighting-filter device 20 will calculate the same instantaneous cost for the first output bit (N times the same cost for the −1 output, N times the same cost for the +1 output). Since the path cost is initialized the same for all paths, the total path cost will be the same. Thus, the selection of the N cheapest paths out of the 2N possibilities will result in N paths that are equal, and the performance of the system 10 will be equal to that of one path. By initializing the path cost of one path to 0, and to a large value for the other paths, the system 10 can reject all expensive paths and continue with the solutions of the initial cheap path and its branches. After $\log_2(N)$ clock cycles, the system 10 will be fully operational and have N different paths. Because the integrator states of every path's weighting-filter device 20 are unique, the weighting-filter device 20 output bits will not become equal and there is no need to check and enforce differentiation of the paths.

Figure 7:
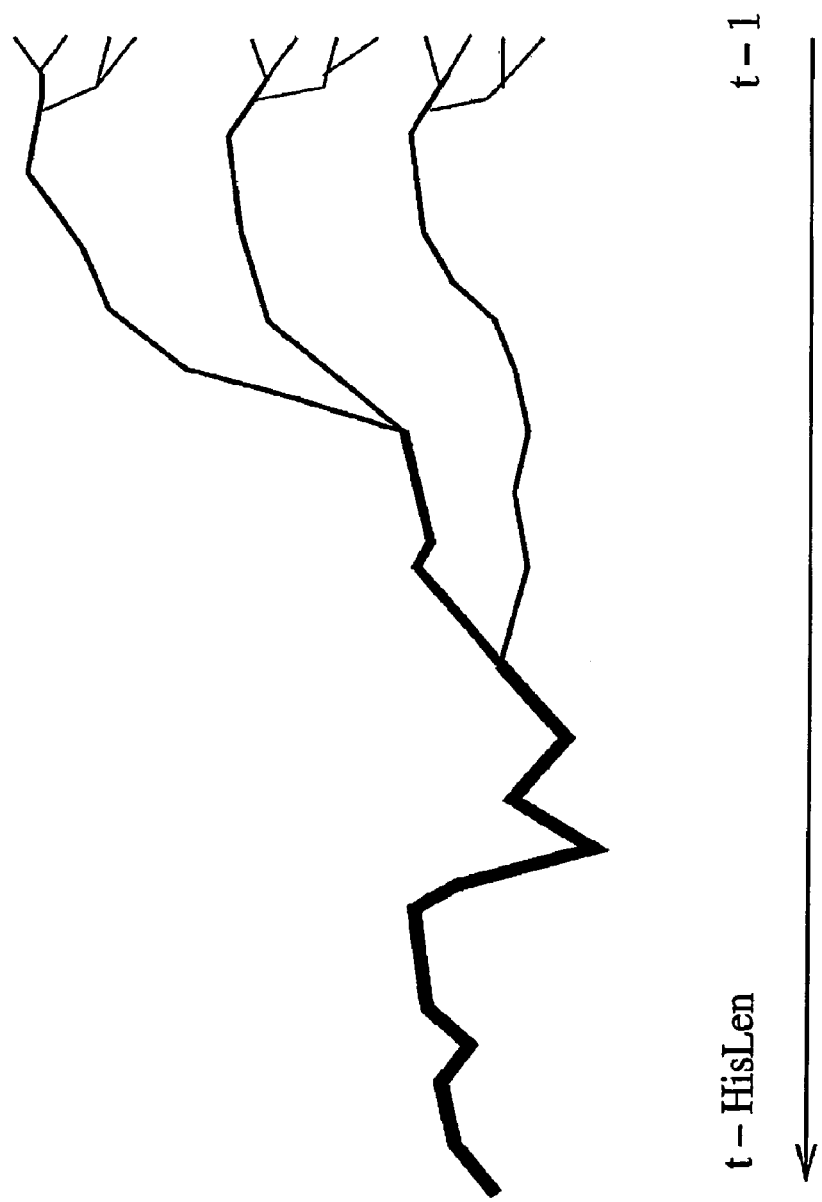
FIG. 7 illustrates the different paths under investigation, in accordance with an exemplary embodiment of the present invention.

Just as in a conventional SDM, a system 10 generates an output sample every clock cycle. However, the most recent output sample was generated in response to input samples history-length clock ticks ago. Since every new input sample can, in theory, cause the system 10 to branch all its paths, and reject half of its solutions, convergence of all paths can be almost instantaneous. However, it is also possible that all N solutions are reasonable and continued to the next time step. In practice, both situations are not very common and only a few long unique paths are tracked. The 'heads' of the paths contain a lot of small 'fingers', that try all possibilities for the newest bits. FIG. 7 illustrates these fingers. The thicker lines correspond to paths that are equal.

Selection of what bit to output is straight-forward, it is the oldest bit in the history buffer of the cheapest path. To avoid introducing any clicks in the output bit-stream, paths that are not in accordance with the output, can be eliminated. The selection of the output bit, is in contrast to the original trellis algorithm, unambiguous and independent of convergence. Truncation noise will not be generated.

Because of the latency introduced by the history buffer, at startup, the system 10 will first output data that is not correlated to the input signal. Only after history length input samples, will actual data be coming out of the system 10. The inverse problem exists at the end of input. Appending additional input silence can be used to flush the buffers.

As shown in FIG. 5, one or more cost functions can be used to generate $C_{+1}(t)$ and $C_{-1}(t)$. An example of a cost function C is given by $$C_1 = \sum_{t=0}^{t} [c(t)]^2 \quad (6)$$

in order to determine the quality of the output bit-streams.

Other cost function examples include:

$$C_2 = \sum_{t=0}^{t=N} |c(t)| \quad (7)$$

or $$C_3 = \sum_{t=0}^{t=N} \alpha \cdot [c(t)]^2 \quad (8)$$

or more generally:

$$C_4 = \sum_{t=0}^{t=N} F(t, x(t), y(t), c(t)) \quad (9)$$

where F ( ) takes as inputs, time, the input value, the output value, and the output value, and performs any function on these.

In another exemplary embodiment, the number of paths varies adaptively. Depending on the quality of the generated bit-streams, more or fewer paths can be calculated. This can be e.g. used to achieve higher performance, or reduce computational load.

TABLE 1

Average compression gain as function of the number of paths.

| Paths | avg. compression |
|---|---|
| SDM | 2.67 |
| 1 | 2.67 |
| 4 | 2.98 |
| 8 | 3.07 |
| 16 | 3.13 |
| 32 | 3.17 |

Table 1 shows the obtained average DST compression gain listed as function of the number of paths. For the data in Table 1, the input signal is a 1 kHz sine wave, amplitude 0.5. The loop filter used is designed to have a Butterworth characteristic with 105 kHz corner frequency, with resonators at 15 and 19 kHz added. The unweighed measured SNR of this design is 121 dB for the given sine. The bitstream of a normal SDM with the same SNR results in a compression of 2.67.

Exemplary embodiments of the present invention may be used in the creation of 1-bit content for Super Audio CD (SACD). Exemplary embodiments of the present invention may be implementation in hardware or software as would be know to one of ordinary skill in the art.

Exemplary embodiments of the present invention may require a history length of around 500 samples for a one to four path system, and around 3000 samples for 32 paths. This should not present a memory size for copying such amounts of memory for every path. When circular buffers are used, most of this copying is not necessary. However, since paths split up quite often, not all copying can be avoided. The same holds for the weighting-filter device states, when a path splits up in two paths, the integrator states may be duplicated, as well as the path cost.

Sorting of the 2N paths on cost should be implemented with care. Since the number of elements to sort is small, generally fast sorts like quicksort or flashsort may perform poorly. A basic insertion sort shows good performance, since the list is in nearly sorted order. Use of an additional pivot as first element can speed up the inner loop significantly.

Figure 8:
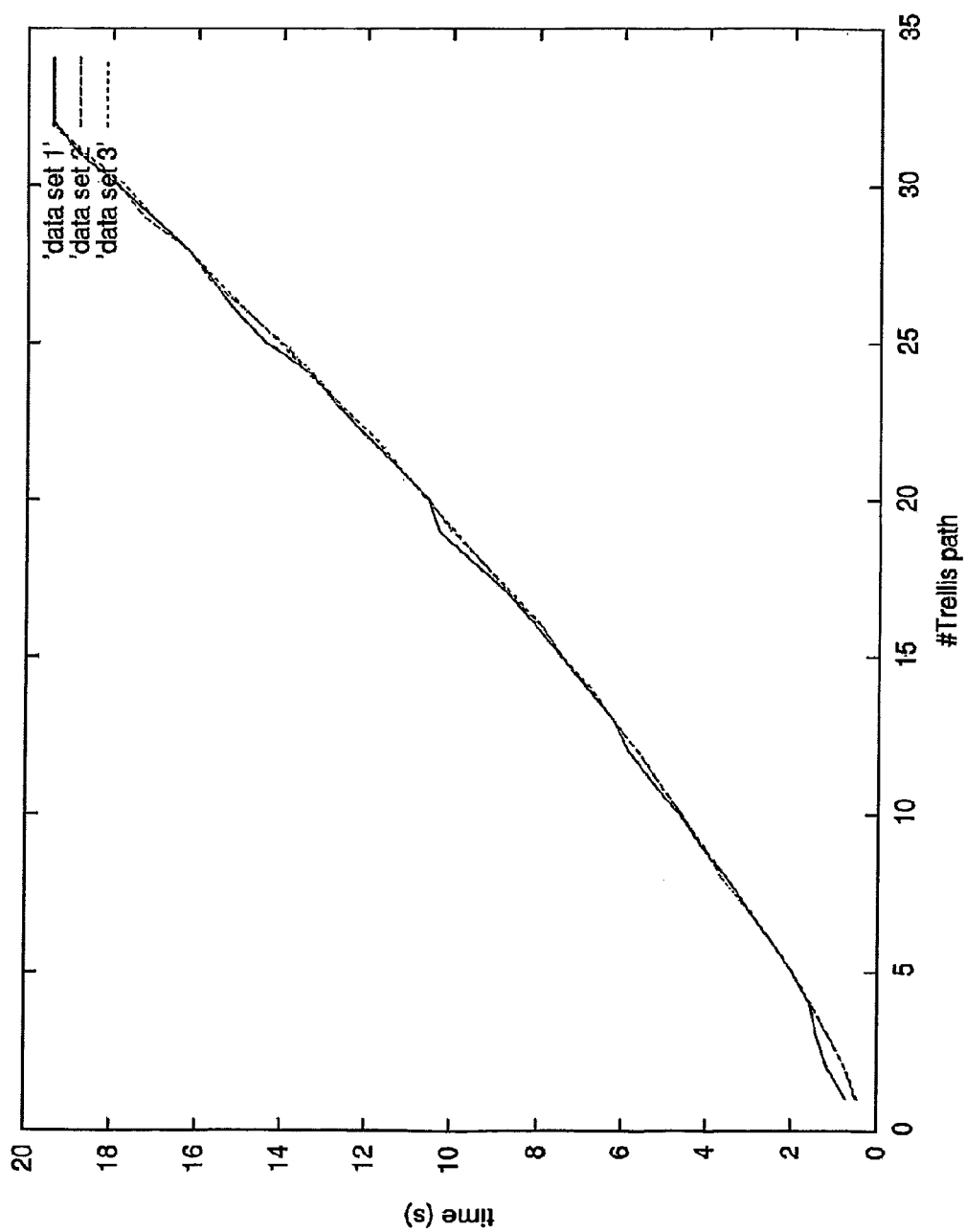
FIG. 8 shows the relationship between the number of trellis paths and required CPU time, in accordance with an exemplary embodiment of the present invention.

FIG. 8 shows the relation between the number of trellis paths and required CPU time. Three different data sets have been used as test signals. The main part of the method is linear in the number of trellis paths. The sorting on cost of the paths adds on average O(nlog(n)) behavior (best case linear, worst case $n^2$). The total method is therefore almost linear. The three different data sets show no difference in processing time. Different settings of history length have also hardly any influence on execution speed (maximum few percent) and is therefore not shown.

Performing a fair comparison between a weighting filter device and a normal SDM is not so easy. The Noise Transfer Function (NTF) of a normal SDM is given by $$NTF_{SDM} = \frac{1}{1 + H(z)} \quad (10)$$

whereas the NTF of a weighting filter device is given by $$NTF_{TrellisSDM} = \frac{1}{H(z)} \quad (11)$$

If the same loop filter is used, the SNR of the normal SDM will be higher since it suppresses the noise more. However, an equivalent loop filter for a weighting filter device can be designed, which will result in the same NTF for a converter with one Trellis path. A comparison of the same trellis converter with a different number of paths is therefore more interesting.

Figure 9:
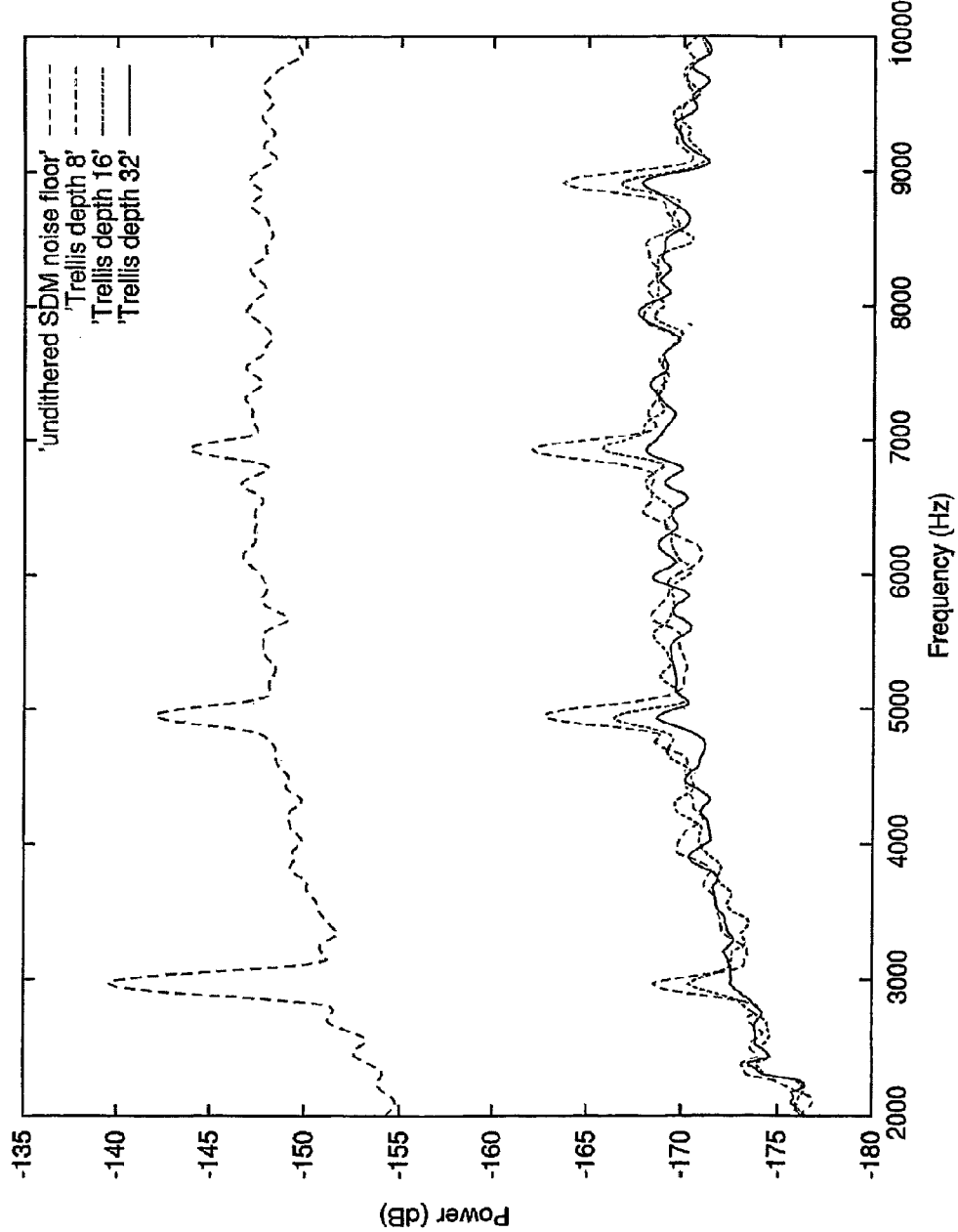
FIG. 9 shows the relationship between the number of trellis paths and output signal quality, in accordance with an exemplary embodiment of the present invention.

FIG. 9 shows a zoom-in of the output spectra for a 0 dB SACD 1 kHz input for 8, 16, and 32 Trellis paths (5th order loop filter, 2.8 MHz sample rate, corner frequency 105 kHz, notches at 15 and 20 kHz). The spectra have been coherently power averaged 128 times in order to make all harmonic distortion visible and 64 times power averaged for smooth plots. Clearly visible is the strong decrease in coherent power for increasing number of trellis paths, indicating increasing linearity. The system 10 with 32 paths does not show any harmonic distortion, not even after the 128 coherent averages. As a reference, the 64 times power averaged spectrum for a normal undithered SDM is shown. All harmonic power of the system 10 solutions is below the noise level of a normal SDM, even without the use of dither.

Figure 10:
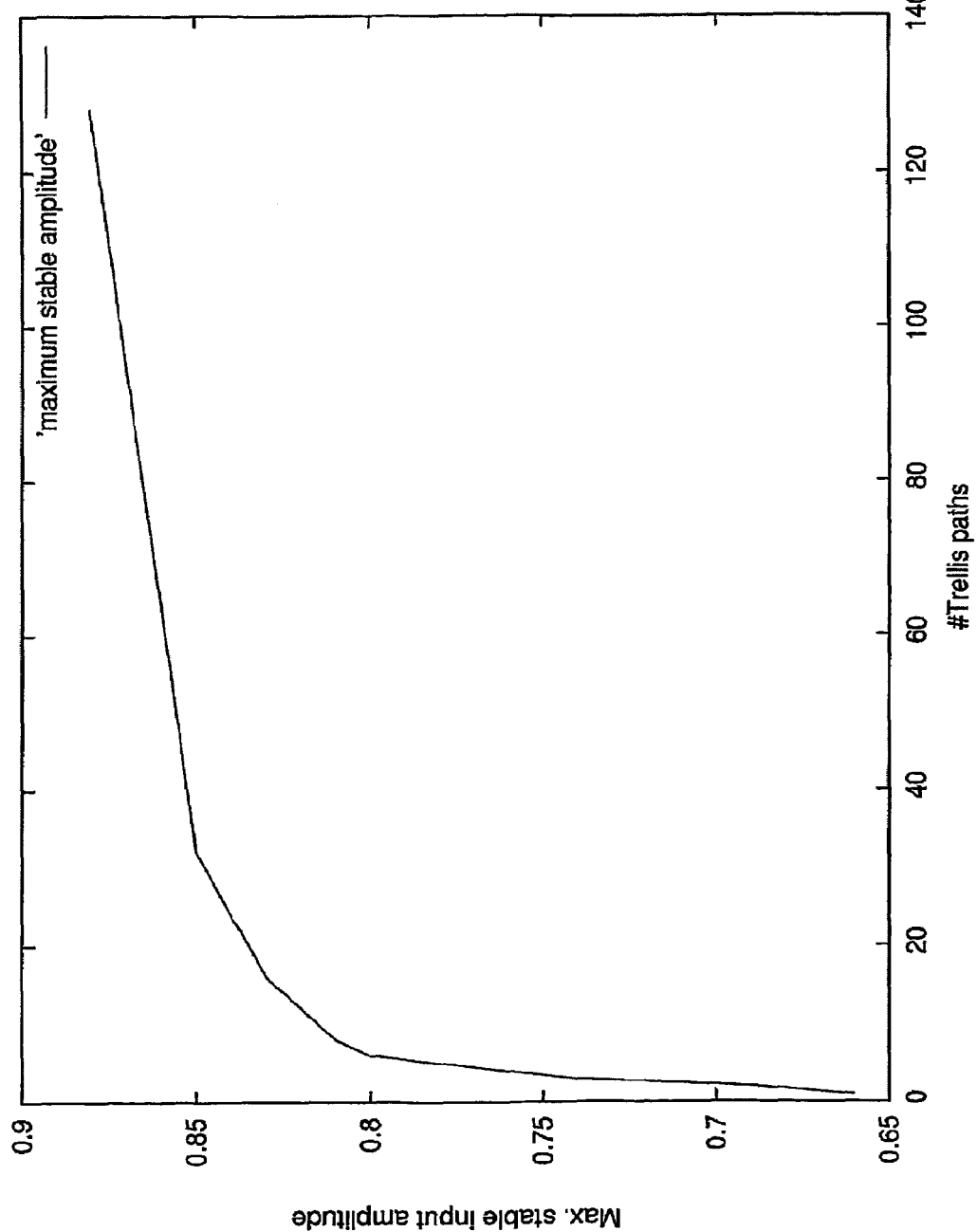
FIG. 10 illustrates the maximum input amplitude that can be applied to a system, in accordance with an exemplary embodiment of the present invention.

FIG. 10 illustrates the maximum input amplitude that can be applied to an exemplary system 10 ($5^{th}$ order, sample-rate 2.8 Mhz, corner frequency 105 kHz, notches at 15 and 20 kHz) that still results in stable operation. The test tone is a 1 kHz sine wave. Going from 1 to 128 paths results in an increase of maximum input amplitude of more than 30%. Going to 8 paths increases the maximum input amplitude from 0.66 to 0.81, an increase of almost 23% already.

Figure 11:
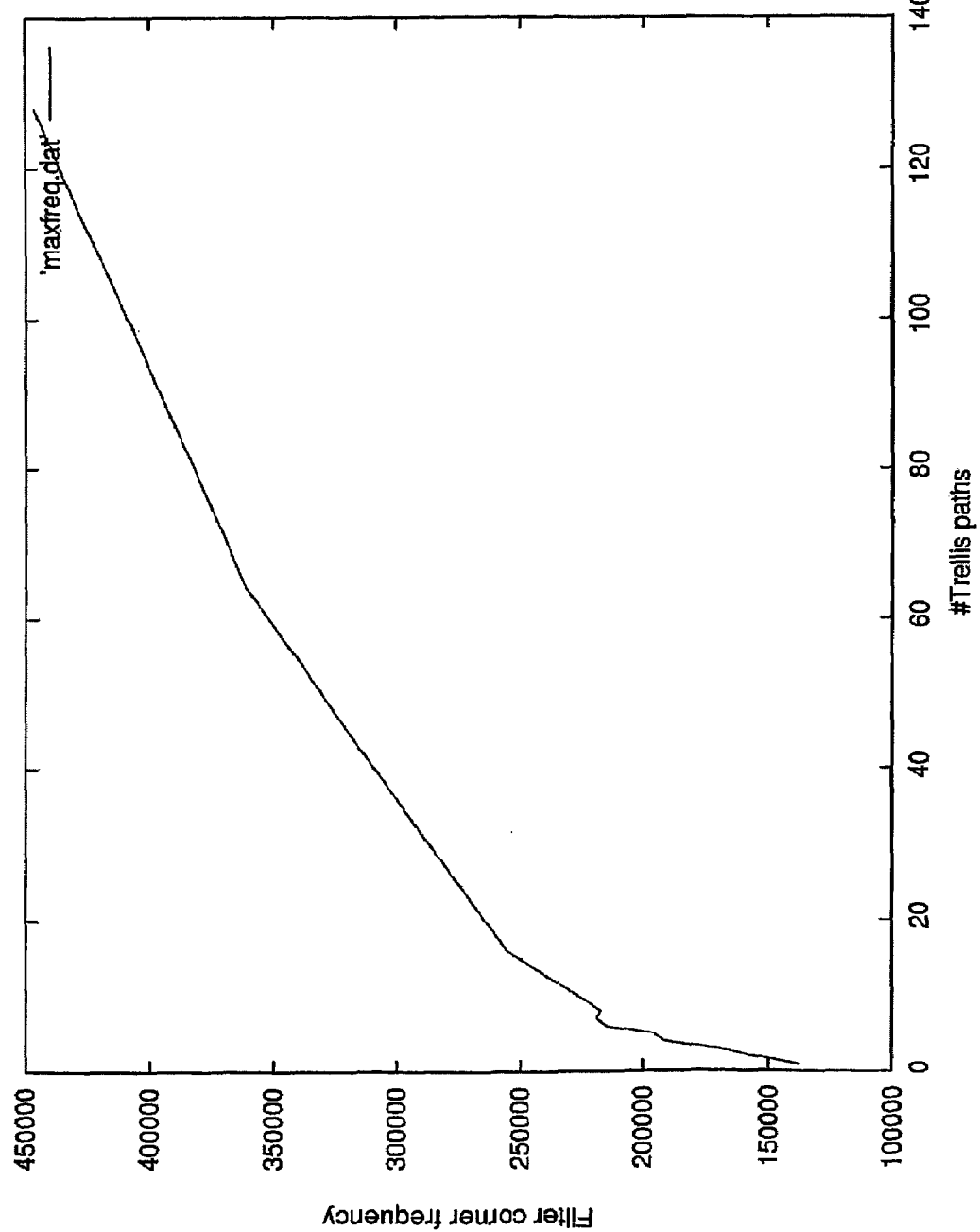
FIG. 11 illustrates the maximum noise-shaping filter corner frequency that can be applied to a system, in accordance with an exemplary embodiment of the present invention.

The increase in stability can also be used to perform more aggressive noise-shaping. To create FIG. 11, the input has been kept constant at 0 dB SACD while the maximum stable corner frequency of the loop filter is examined as function of the number of trellis paths. Again the $5^{th}$ order loop filter contains two notches at 15 and 20 kHz. For one trellis path, the maximum corner frequency that results in stable operation is 137 kHz. Going to 8 paths increases this limit to 217 kHz, while 128 paths results in a maximum stable corner frequency of 445 kHz.

It is further noted that the input need not be restricted to a bitstream; the input may be analog or digital. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed. as limiting the claims. The word "comprising" does not exclude the presence of other elements or steps than those listed in a claim. The modifiers "a", "an", "one" and "at least one" as used in the appended claims all are intended to include one or more of whatever they modify. The invention can be implemented by means of hardware comprising several distinct elements, and by means of a suitable programmed computer. In a device claim enumerating several means, several of these means can be embodied by one and the same item of hardware. The mere factor that certain measures are recited in mutually different dependent claims does not indicate that a combination of these measures cannot be used to advantage.

The invention claimed is:

1. A system (10), comprising:
   N weighting-filter devices (where $N \geq 2$) (20), each receiving an input signal and a M-value feedback signal (where $M \geq 2$) and each generating M filtered output signals;
   a path sorter (30) for applying at least one cost function to the N*M filtered output signals to produce the N cheapest paths;
   a normalizer (40) for normalizing the N cheapest paths; and
   an output device (50) for selecting an output signal and for supplying the N M-value feedback signals to the N weighting-filters (20).

2. The system (10) of claim 1, wherein the at least one cost function is a function of at least one output signal characteristic.

3. The system (10) of claim 1, wherein each of the N weighting-filter devices (20) includes a M-value generator and a filter.

4. The system (10) of claim 3, wherein each weighting-filter device (20) includes a subtractor for subtracting the input signal and the M-value feedback signal and filtering the M output signals.

5. The system (10) of claim 1, wherein the M-value feedback signal includes two values, −1 and 1.

6. The system (10) of claim 1, wherein N is fixed or adaptive.

7. The system (10) of claim 4, wherein each of the weighting-filter devices (20) includes a fixed order, fixed frequency response filter; a fixed order, variable frequency response filter; a variable order, fixed frequency response filter; a variable order, variable frequency response filter; or a noise-shaping filter adjustable for Direct Stream Transfer (DST) performance.

8. The system (10) of claim 1, wherein the system (10) is implemented in software and/or hardware.

9. The system (10) of claim 1, wherein the system (10) is used for analog-digital, digital-analog, and/or digital-digital (AD/DA/DD) conversion and/or pulse width modulation (PWM).

10. A method, comprising:

receiving an input signal and at least two M-value feedback signals (where $M \geq 2$) and generating M*N filtered output signals;

applying at least one cost function to the M*N filtered output signals to produce the N cheapest paths;

normalizing the N cheapest paths; and selecting an output signal from the N cheapest paths and for generating the at least two M-value feedback signals.

* * * * *